(12) United States Patent
Nuhlicek et al.

(10) Patent No.: US 6,190,111 B1
(45) Date of Patent: Feb. 20, 2001

(54) TRAY INVERTING APPARATUS AND METHODS

(75) Inventors: John C. Nuhlicek, Elk River; James E. Kroening, St. Paul, both of MN (US)

(73) Assignee: Aetrium Incorporated, North St. Paul, MN (US)

( * ) Notice: Under 35 U.S.C. 154(b), the term of this patent shall be extended for 0 days.

(21) Appl. No.: 09/132,581

(22) Filed: Aug. 11, 1998

(51) Int. Cl.[7] .................................................... B65G 47/24
(52) U.S. Cl. ........................ 414/405; 414/810; 414/415; 414/421; 198/402
(58) Field of Search .................................... 414/403, 405, 414/810, 811, 766, 415, 421, 754, 764; 198/402; 53/744, 266.1

(56) References Cited

U.S. PATENT DOCUMENTS

| | | | |
|---|---|---|---|
| 4,773,816 | * | 9/1988 | Fuller, Jr. et al. ................ 414/405 X |
| 4,830,564 | * | 5/1989 | Walker et al. ........................ 414/405 |
| 4,880,101 | * | 11/1989 | Wiggins ............................ 414/405 X |
| 5,360,309 | * | 11/1994 | Ishiguro ............................ 414/405 X |

* cited by examiner

*Primary Examiner*—Frank E. Werner
(74) *Attorney, Agent, or Firm*—Alan Kamrath; Oppenheimer Wolff & Donnelly LLP

(57) ABSTRACT

An apparatus (10) for simultaneously inverting a plurality of semiconductor devices includes a conveyor (12) for conveying an input tray below a frame (32) having a primer tray captured therein by tray captivators (64). The input tray is elevated by an elevator (20) and the primer tray is lowered by lowering the frame (32) until the trays are closely adjacent. After the tray captivators (64) release the primer tray, tray clamps (44) are moved inwardly to extend over the sides of the trays, and jaws (52, 56) are moved to clamp the trays together. The frame (32) is rotated to invert the clamped trays. The input tray s then captured by the tray captivators (64) as the tray lamps (44) are released and acts as the primer tray for the next operation. After release of the tray clamps (44), the ay including the devices in an inverted orientation is lowered to be conveyed by the conveyor (12).

20 Claims, 4 Drawing Sheets

TRAY INVERTING APPARATUS AND METHODS

BACKGROUND

The present invention generally relates to the inverting of devices, and particularly to the simultaneous inverting of a plurality of devices.

During the manufacture of devices such as semiconductors and similar electronic devices, such devices must be tested for operability, efficiency, and other conditions. Thus, a need exists for apparatus which mechanically handles such devices to reduce the cost of such testing. Additionally, such mechanical handling also includes the need to perform tests or other functions on both sides of the device.

When it is necessary to remove the device from the carrier or tray, inverting apparatus such as of the type disclosed in U.S. Pat. No. 5,374,158 has proven to be very effective. However, especially when it is not necessary to remove the devices from the carrier such as for mechanical vision testing, branding, or the like, inverting the devices one at a time is very time consuming and inefficient.

Thus, a need exists for simultaneously placing a plurality of devices contained in a first carrier in an inverted orientation. Past attempts to solve this need have not proven to be effective. Specifically, the positioning of the devices in the carrier is required for referencing the results of the various tests and other processing operations to individual devices. Because of warping of the carrier and for other reasons, devices tended to move in the carrier while they were being inverted so that damage to the devices such as to the leads thereof during the inverting process or during later handling operations and/or so that reference positioning was lost in the carrier. Additionally, devices also tended to fall from the carrier which is clearly undesirable due to the loss of the devices themselves but also because of the potential the devices could fall upon and short out electrical equipment in the vicinity.

SUMMARY

The present invention solves this need and other problems in the field of simultaneously inverting a plurality of devices carried in a carrier or tray by providing, in the preferred form, an input tray carrying the plurality of devices which is conveyed beneath and moved to be closely adjacent to a primer tray so that the trays can be clamped together and rotated, with the primer tray carrying the plurality of devices in an inverted orientation and after unclamping from the input tray being moved to be spaced from the input tray and conveyed from beneath of the input tray which then acts as the primer tray for the next inverting operation.

It is thus an object of the present invention to provide novel methods and apparatus for simultaneously inverting a plurality of devices.

It is further an object of the present invention to provide such novel inverting methods and apparatus utilizing standard semiconductor matrix trays.

It is further an object of the present invention to provide such novel inverting methods and apparatus providing ease of changeover between different tray types, orientations, and directions.

It is further an object of the present invention to provide such novel inverting methods and apparatus which maintain device positioning even when warped trays are utilized.

It is further an object of the present invention to provide such novel inverting methods and apparatus which interrupt operation when desired, monitored conditions are not being sensed.

It is further an object of the present invention to provide such novel inverting methods and apparatus having increased throughput.

These and further objects and advantages of the present invention will become clearer in light of the following detailed description of an illustrative embodiment of this invention described in connection with the drawings.

DESCRIPTION OF THE DRAWINGS

The illustrative embodiment may best be described by reference to the accompanying drawings where.

Figure 1:
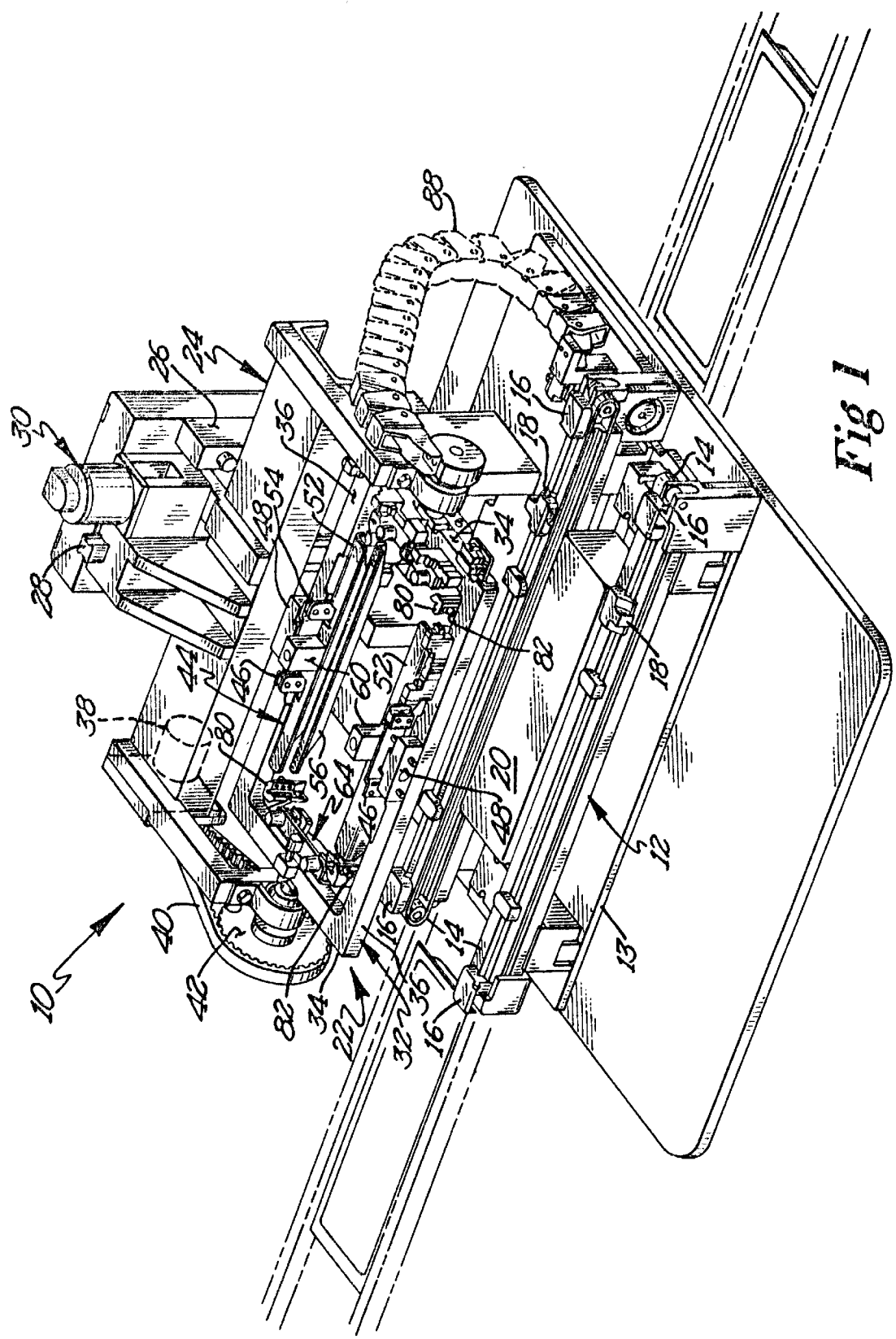
FIG. 1 shows a perspective view of an inverting apparatus according to the preferred teachings of the present invention, with portions shown in phantom.
Figure 2:
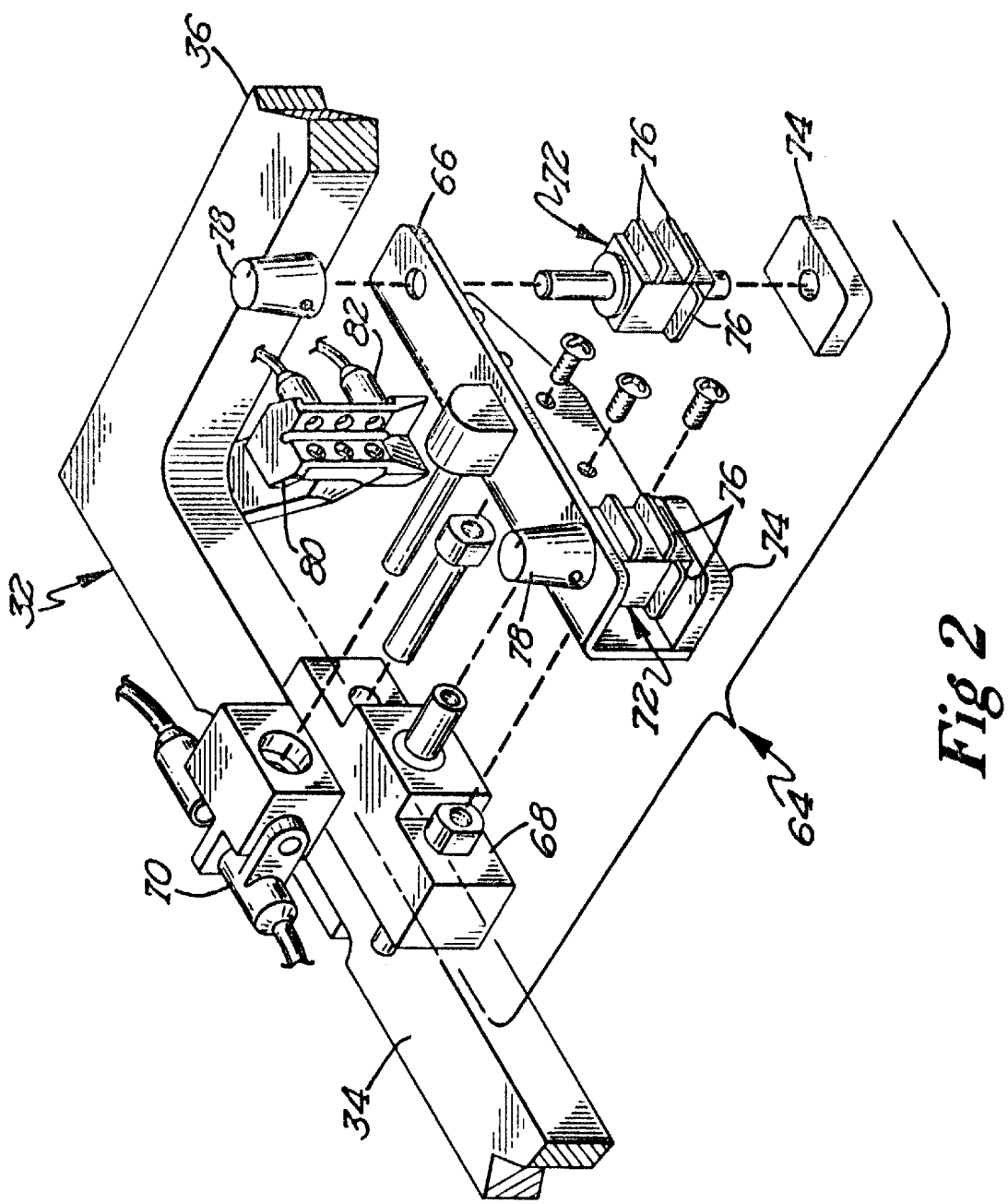
FIG. 2 shows a partial, exploded, perspective view of the inverting apparatus of FIG. 1.
Figure 3:
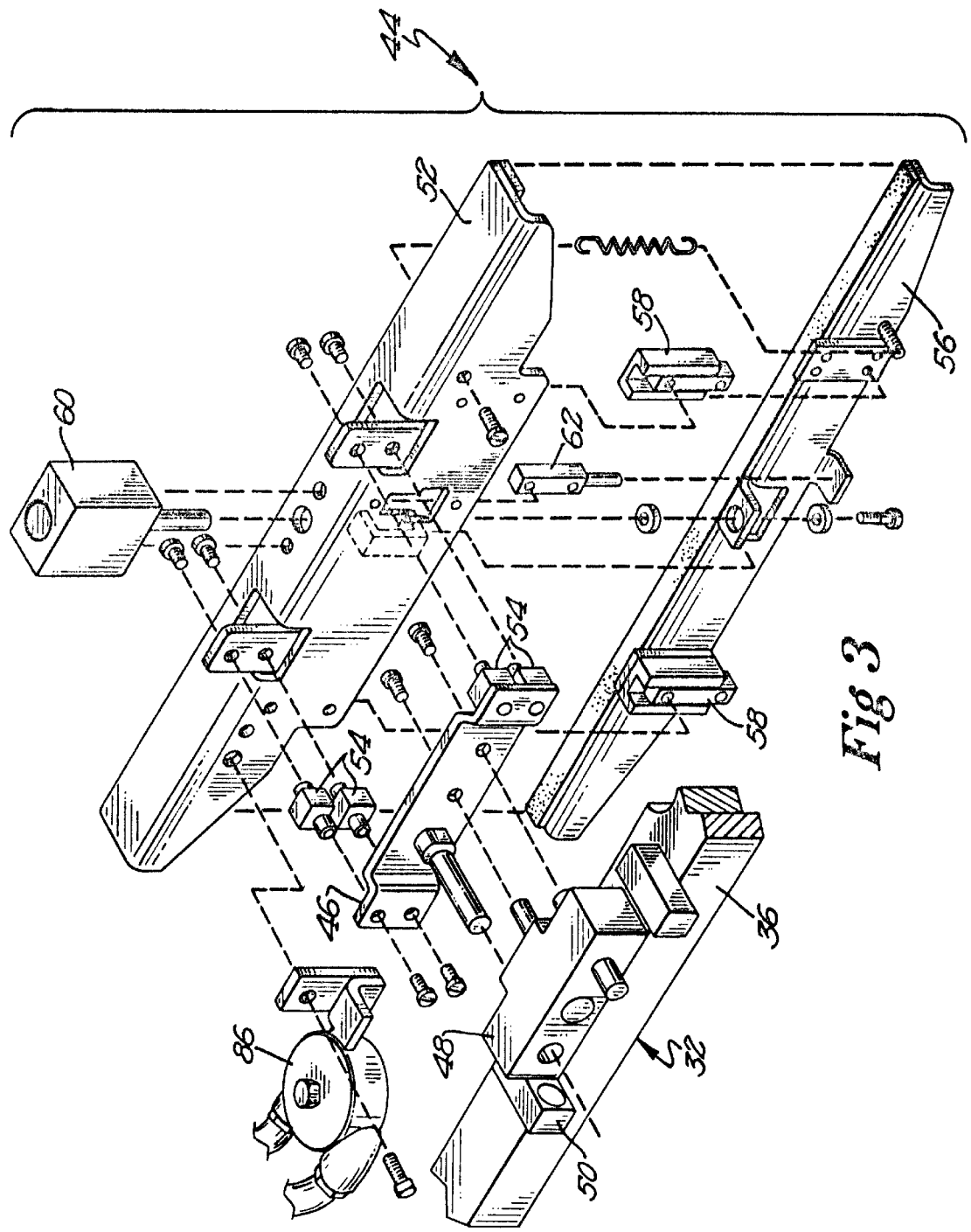
FIG. 3 shows a partial, exploded, perspective view of the inverting apparatus of FIG. 1.
Figure 4:
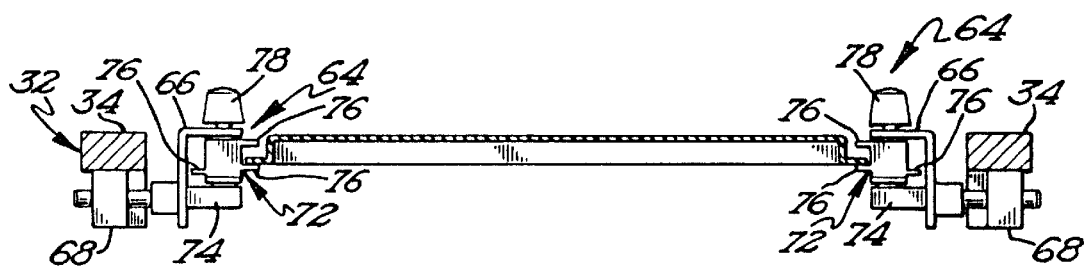
FIGS. 4–7 show diagrammatic views illustrating a preferred mode of operation of the inverting apparatus of FIG. 1.
Figure 5:
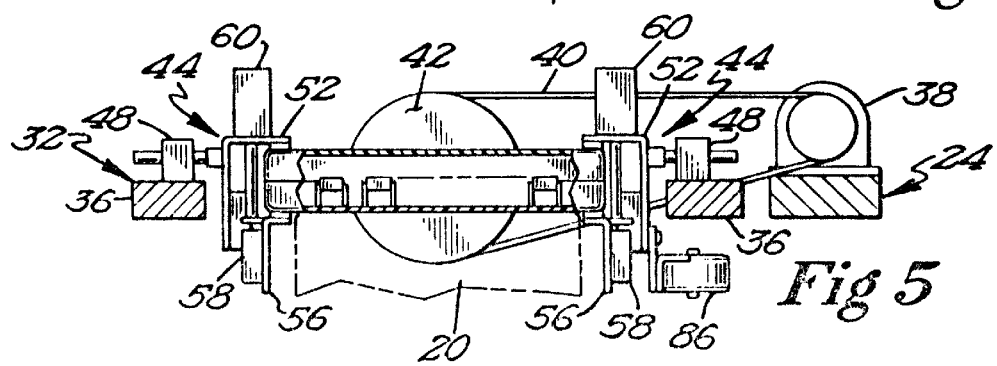
Figure 6:
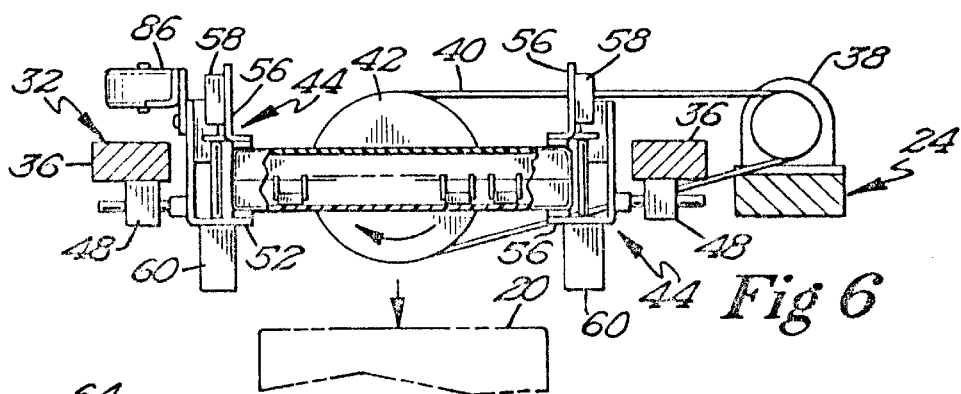
Figure 7:
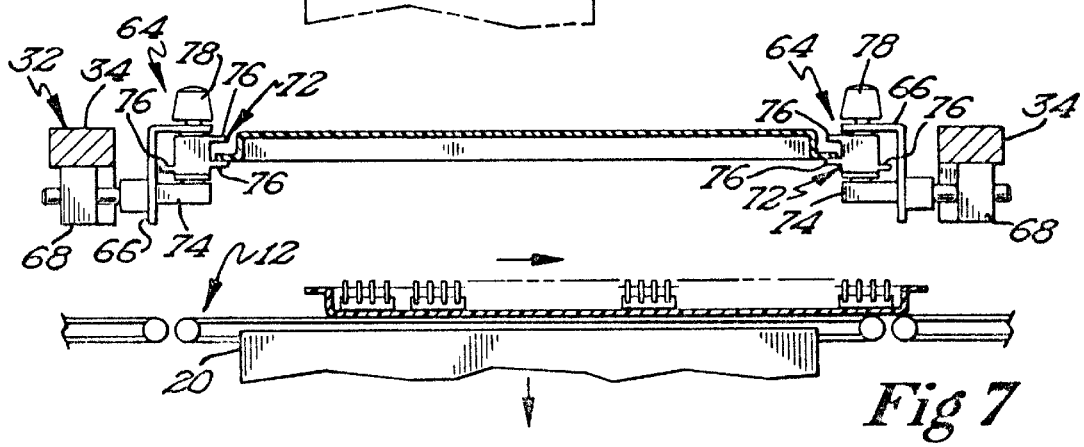

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Where used in the various figures of the drawings, the same numerals designate the same or similar parts. Furthermore, when the terms "top", "bottom", "first", "second", "front", "back", "upper", "lower", "height", "width", "length", "thickness", "end", "side", "upstream", "downstream", "horizontal", "vertical", and similar terms are used herein, it should be understood that these terms have reference only to the structure shown in the drawings as it would appear to a person viewing the drawings and are utilized only to facilitate describing the illustrative embodiment.

DESCRIPTION

An apparatus according to the preferred teachings of the present invention for automatically transporting semiconductor trays to a processing position, inverting the tray, and then transporting the tray including inverted devices to the next testing or handling station is shown in the drawings and generally designated 10. Generally, apparatus 10 includes a conveyor 12 secured to a base plate 13. Conveyor 12 can be of a variety of forms including of conventional design and can be adjustable for conveying trays of differing widths. In the preferred form, conveyor 12 includes first and second belts 14 for engaging a tray carrying a plurality of semiconductor devices adjacent to the sides of the tray, with the belts 14 being suitably synchronized driven to maintain accurate tray positioning along the line of travel. Conveyor 12 further includes suitable sensors 16 such as at the entrance and exit of belts 14 to monitor the location of the tray along the line of travel. Tray stops 18 which in the most preferred form are pneumatically actuated are provided on conveyor 12 to interface with the front of the tray, beneath the tabs, to stop belts 14 and the travel of the tray when the tray reaches the processing position.

In the most preferred form, apparatus 10 includes an elevator 20 for raising the tray off belts 14 of conveyor 12. Elevator 20 can be of a variety of forms including of conventional design such as but not limited to being lead screw driven. Elevator 20 is secured to base plate 13 between belts 14 and is movable between a lowered position located below the tray supported upon belts 14 of conveyor 12 to an upper hand off position for supporting the tray above belts 14 and conveyor 12. In the most preferred form, elevator 20 incudes a suitable sensor such as an encoder on the drive motor for detecting the position of elevator 20.

Apparatus 10 according to the teachings of the present invention includes a flipper assembly 22. Generally, flipper assembly 22 includes a lift platform 24 having a U-shape in the preferred form. Assembly 22 further includes suitable provisions for movably mounting the lift platform 24 between an upper position and a lower, hand off position. In the preferred form, a flipper mount 26 is secured to base plate 13 adjacent to conveyor 12 and the processing position. Lift platform 24 is slideably mounted for vertical movement relative to conveyor 12 such as by a linear bearing 28 including a guide rail suitably mounted to mount 26 and a runner block mounted to lift platform 24 and slideable along the guide rail. Lift platform 24 is moved relative to conveyor 12 by a drive assembly 30 such as a lead screw rotatably mounted to mount 26 and arranged parallel to the guide rail of linear bearing 28 and rotated by a motor. A lift plate is secured to lift platform 24 and threadably received on the lead screw of drive assembly 30. Thus, when the lead screw is rotated by the motor, the axial position of the lift plate changes along the lead screw causing movement of lift platform 24 relative to mount 26 and conveyor 12. In the most preferred form, drive assembly 30 includes a suitable sensor such as an encoder on the motor for detecting the position of lift platform 24.

Flipper assembly 22 further includes a flipper frame 32 of a generally rectangular shape. In particular, frame 32 generally includes first and second, spaced, parallel ends 34 extending generally perpendicularly between first and second sides 36 extending in a spaced, parallel relation. In the preferred form, the length of sides 36 or in other words the spacing between ends 34 is slightly greater than the length of the trays intended to be processed in apparatus 10. The length of ends 34 or in other words the spacing between sides 36 is slightly greater than the width of the trays intended to be processed in apparatus 10. Flipper frame 32 is suitably rotatably mounted between the legs of lift platform 24 for rotation about an axis extending parallel to and intermediate sides 36. Suitable provisions are provided to rotate flipper frame 32 generally 180°. Specifically, in the preferred form, a stepper motor 38 is suitably mounted to lift platform 24 for driving an endless belt 40 extending around a pulley 42 secured to flipper frame 32 and centered on its axis. Similarly, a pneumatic drive can be utilized to rotate flipper frame 32.

First and second tray clamps 44 are mounted to frame 32 for simultaneously clamping the side edges of two trays. Generally, each clamp 44 includes a mounting plate 46 movably mounted relative to frame 32 and in particular parallel to a plane extending through sides 36 for movement between a home position and a clamping position. In the preferred form, a pneumatically operated slide actuator 48 is mounted to each of sides 36 including at least one slideable piston and one or more slide guide pins secured to mounting plate 46, with slideable movement of the piston resulting in movement of mounting plate 46 relative to side 36. A suitable sensor 50 such as a linear potentiometer monitors the position of mounting plate 46 relative to frame 32.

Clamps 44 each further include a first, elongated L-shaped jaw 52 suitably mounted to the respective mounting plate 46 in a manner to generally prevent the transmission of vibration from jaw 52 to mounting plate 46 such as by the use of rubber vibration mounts 54. A second, elongated L-shaped jaw 56 is movably mounted to first jaw 52 for movement between an unclamped position and a clamped position such as by one or more linear bearing 58 including a guide rail suitably mounted to one of jaws 52 and 56 and a runner block suitably mounted to the other of jaws 52 and 56. In the most preferred form, jaws 52 and 56 have elongated lengths generally equal to but slightly less than the length of the sides of the trays to be processed. A pneumatically operated slide actuator 60 is mounted to first jaw 52 and includes a slideable piston secured to second jaw 56, with slideable movement of the piston resulting in movement of second jaw 56 relative to first jaw 52. A suitable sensor 62 such as a linear potentiometer monitors the position of jaw 56 relative to jaw 52.

First and second tray captivators 64 are mounted to frame 32 for simultaneously holding the front and back of a tray. Generally, each captivator 64 includes an L-shaped mounting plate 66 movably mounted relative to frame 32 and in particular parallel to a plane extending through ends 34 for movement between a tray engaging position and a disengaged position. In the preferred form, a pneumatically operated slide actuator 68 is mounted to each end 34 including at least one piston and one or more slide guide pins secured to mounting plate 66, with slideable movement of the piston resulting in movement of mounting plate 66 relative to end 34. A suitable sensor 70 such as a through beam optical detector monitors the position of mounting plate 66 relative to frame 32.

Captivators 64 each further includes first and second spindles 72 rotatably mounted to mounting plate 66 about axes generally perpendicular to the slideable movement of mounting plate 66 and the axis of frame 32. In the preferred form, spindles 72 are rotatably mounted by having opposite ends extending through apertures formed in mounting plate 66 and a shelf 74 suitably secured to mounting plate 66 such as by screws. Spindles 72 include multiple faces each having one or more ears 76 for engaging different types and orientations of ribs on the front and back of the trays to be processed, with spindles 72 including four faces in the most preferred form. Suitable provisions for positioning spindles 72, preferably without the use of tools, so that ears 76 correspond to the particular type of tray to be processed are presented by captivators 64 are provided such as knobs 78 when manual positioning is utilized.

According to the preferred teachings of the present invention, frame 32 further includes four L-shaped corner guide standoffs 80 located at the intersections of ends 34 and sides 36 and are intended to slideably abut with and guide the corners between the sides and the front and back of the trays to be processed. Each standoff 80 includes first and second sensors 82 for detecting the presence of first and second trays with the respective standoff 80.

In the most preferred form, apparatus 10 includes a pneumatically or electrically operated, eccentric type vibrator 86 mounted to first jaw 52 of one tray clamp 44 for purposes of vibrating the clamped trays.

It should be appreciated that for ease of illustration, electrical and pneumatic lines such as but not limited to for actuators 48, 60, and 68 and sensors 50, 62, 70, and 82 have been broken away. In this regard, an energy chain cable carrier 88 has been provided for carrying all electrical and pneumatic lines to frame 32 in the preferred form.

Now that the basic construction of apparatus 10 according to the preferred teachings of the present invention has been explained, a preferred mode of operation can be set forth and some of the advantages obtained thereby can be highlighted. It should be appreciated that apparatus according to the preferred teachings of the present invention is able to process a variety of tray types having particular tab configurations. However, in all cases, the trays must be double sided of a "flippable" variety. Also, the orientation of the tabs of the trays may be different if the semiconductor devices are in either a "live bug" orientation or in other words with the ends of the leads pointing downward or a "dead bug" orientation or in other words with the ends of the leads pointing upward. In the preferred form, apparatus 10 must be initially set up according to the configuration and orientation of the tabs of the trays to be processed. In particular, in the most preferred form, all four spindles 72 are manually rotated by use of knobs 78 until the faces including ears 76 corresponding to the tray tab configuration and orientation are presented in tray captivators 64.

After configuring tray captivators 64, a primer tray, which acts as the cover tray for the initial tray flipping, must be positioned in apparatus 10. In particular, tray captivators 64 are moved inward in tray engaging positions so that ears 76 engage the tabs on the front and back of the primer tray so that the primer tray is captured in frame 32 by tray captivators 64. In this initial condition, tray clamps 44 are located in home positions outward of and not engaging the primer tray, with jaws 52 and 56 being separated in the unclamped positions. Frame 32 and the primer tray held therein by tray captivators 64 are horizontal and are parallel to and spaced above conveyor 12. In the most preferred form, elevator 20 is in its lower position, and lift platform 24 and thus frame 32 and the primer tray held therein are in their upper position. In the most preferred form, the primer tray is automatically loaded in frame 32 at the start of the processing run or lot and is automatically unloaded at the end of the processing run or lot under the control of the electric controller of apparatus 10. However, the primer tray can be loaded and unloaded in frame 32 in any desired manner. The presence of the primer tray and the position of captivators 64, frame 32, and lift platform 24 can be monitored by sensors 80 and 70 and the sensors associated with motor 38 and with drive assembly 30, with the electronic controller of apparatus 10 interrupting operation if the desired monitored condition is not being sensed.

For purposes of explanation, it will be assumed that apparatus 10 is in a condition to receive a semiconductor tray, and in particular either there is no prior tray (other than the primer tray) in apparatus 10 or that a tray including inverted semiconductor devices is being conveyed out of apparatus 10 by conveyor 12. The presence of a prior tray can be monitored at least by sensors 16, with the electronic controller of apparatus 10 interrupting operation if apparatus 10 is not in condition to receive a semiconductor tray. In particular, the input tray carrying a plurality of devices in an input orientation will enter conveyor 12 and will be conveyed in a travel direction by belts 14 until the front of the tray engages stop 18 which stop movement of belts 14 and the travel of the tray. The input tray will then be in a processing position on conveyor 12 located vertically below the primer tray in frame 32.

In the processing position, the input tray is located vertically directly above elevator 20 and below the primer tray in frame 32. Elevator 20 is moved from its lower position to its hand off position, with elevator 20 raising the input tray from conveyor 12 and to the hand off position above conveyor 12. Simultaneously, lift platform 24 and thus frame 32 are moved from its upper position to its hand off position. As elevator 20 and lift platform 24 are moving to their hand off positions, the input tray on elevator 20 will slide in standoffs 80 so as to generally align the semiconductor carrying tray with the primer tray. The semiconductor carrying tray is beneath and closely adjacent the primer tray in a generally abutting manner when elevator 20 and lift platform 24 are in their hand off positions. Elevator 20 abuts with the lower surface of the semiconductor carrying tray and does not extend and is located inwardly of the perimeter of the semiconductor carrying tray defined by its front, back and sides. Thus, elevator 20 does not interfere with the positioning of frame 32 and the components carried thereby relative to the semiconductor carrying tray. It should also be appreciated that elevator 20 elevates the semiconductor carrying tray above conveyor 12 so that frame 32 and the components carried thereby do not engage conveyor 12. Further, simultaneous movement of elevator 20 and lift platform 24 and thus simultaneous movement of both of the input and prime trays is also advantageous in increased throughput as travel time can be reduced. However, apparatus 10 could be designed according to the teachings of the present invention where vertical movement occurs as the result of a single movement direction. The positioning of elevator 20 and lift plate 24 and the presence of both the primer and semiconductor carrying trays in frame 32 can be monitored by sensors 82 and the sensors associated with elevator 20 and drive assembly 30, with the electronic controller of apparatus 10 interrupting operation if the desired monitored condition is not being sensed.

As previously indicated and in the most preferred form, while elevator 20 and lift platform 24 are moving to their hand off positions, tray clamps 44 are positioned in their home positions outwardly of the sides of the primer tray and the semiconductor carrying tray, with jaws 52 and 56 being spaced in their unclamped positions. After elevator 20 and lift platform 24 reach their hand off positions, tray captivators 64 are moved outwardly by actuators 68 to remove the abutment of ears 76 with the tabs of the primer tray and thereby releasing the capture of the primer tray by tray captivators 64 so that the primer tray rests upon the semiconductor carrying tray. In the preferred form, after captivators 64 are moved outwardly, lift platform 24 is lowered a distance generally equal to the thickness of a tray to reestablish the final captivator position for the next primer tray. Then, tray clamps 44 are moved inwardly by actuators 48 to their clamping positions so that the sides of the abutting trays are positioned between jaws 52 and 56. At that time, actuators 60 are actuated to move jaws 56 relative to jaws 52 to their clamped position so that the trays are tightly clamped between jaws 52 and 56. It should be appreciated that standoffs 80 according to the preferred teachings of the present invention insure proper tray alignment between and during clamping. The inward positioning of tray clamps 44, the outward positioning of tray captivators 64, and the positioning of jaws 56 can be monitored by sensors 50, 62, and 70, with the electronic controller of apparatus 10 interrupting operation if the desired monitored condition is not being sensed. In this regard, sensor 62 monitors the spacing between jaws 52 and 56 in the clamped position to be within a tolerable range to especially insure that the spacing between jaws 52 and 56 is not too great which would indicate that something (such as a mispositioned semiconductor) is preventing the trays from being abutted directly together.

It should be appreciated that the elongated length of jaws 52 and 56 generally equal to but slightly shorter than the length of the sides of the clamped trays according to the preferred teachings of the present invention is especially advantageous in insuring that the trays are clamped in a manner so that positioning of the devices in the carrier pockets is maintained during the inverting operation. In particular, due to manufacturing tolerance and due to their use over time, trays become warped, with the warpage of trays not necessarily being consistent from tray to tray. Warped trays were a major reason of operational failures of prior attempts to simultaneously flip a plurality of devices in a tray. According to the teachings of the present invention, apparatus 10 is able to distort warped trays in a manner so that the trays flushly abut to maintain reference positioning of each of the plurality of devices and if unable to do so will interrupt operation to avoid loss of reference positioning and/or dropping of the devices during operation.

After the trays are clamped between jaws 52 and 56, elevator 20 is moved from its hand off position toward its lowered position (which could be at position generally equal to the height of conveyor 12) and lift platform 24 is moved from its hand off position toward its upper position, with the trays being clamped in frame 32 by tray clamps 44. In particular, frame 32 is positioned so that it can be rotated in lift platform 24 without abutment with elevator 20 or conveyor 12 or any other component of apparatus 10. The positioning of elevator 20 and lift platform 24 can be monitored by sensors associated with elevator 20 and drive assembly 30, with the electronic controller of apparatus 10 interrupting operation if the desired monitored condition is not being sensed.

After frame 32 is in a nonabutting position, frame 32 is rotated 180° about the rotatable axis of frame 32 which extends along the major or long axis of the clamped trays so that the primer tray is now positioned beneath the input tray and the input tray is positioned above the primer tray. It can be appreciated that the plurality of devices are now carried by the primer tray in an output orientation inverted from the input orientation, or in other words the primer tray now becomes an inverted semiconductor carrying tray, with the semiconductor devices tending to be supported by the lower tray due to gravitational forces. However, to prevent semiconductor devices from sticking to or otherwise remaining in the upper tray and/or to help properly seat the semiconductor devices in the lower tray, vibrator 86 can be activated to vibrate the clamped trays at any desired time after frame 32 is rotated. In this regard, due to the presence of vibration mounts 54, vibration from vibrator 86 is generally not transmitted to frame 32 as well as the other components of apparatus 10. Isolation from vibration is advantageous in increasing component life, especially for sensor, electrical, and pneumatic control components. Alternately, or in addition, stepper motor 38 can rotate in a varying accelerating or jerky manner to help loosen the semiconductor devices in the tray pockets during inverting. Rotation of frame 32 can be monitored by the sensor provided in stepper motor 38, with the electronic controller-of apparatus 10 interrupting operation if the desired monitored condition is not being sensed.

After frame 32 has been inverted, lift platform 24 is moved from its upper position to its hand off position and elevator 20 is moved from its lower position to its hand off position. The position of lift platform 24 and elevator 20 can be monitored by sensors associated with elevator 20 and drive assembly 30, with the electronic controller of apparatus 10 interrupting operation if the desired monitored condition is not being sensed.

After elevator 20 and lift platform 24 are in their hand off positions, actuators 60 are actuated to separate jaws 52 and 56. While jaws 52 and 56 are separating, actuators 68 are actuated to move tray captivators 64 inward to their tray engaging position so that ears 76 engage the tabs of the input tray, with ears 76 not engaging the tabs of the inverted semiconductor carrying tray (which was previously the primer tray at the start of the operation). Thus, the input tray is captured by tray captivators 64 in frame 32.

Also, actuators 48 are actuated to move tray clamps 44 outward to their home position. The positions of tray clamps 44, of jaws 52 and 56, and of tray captivators 64 and that only a single tray is captured in frame 32 can be monitored by sensors 50, 62, 70, and 82, with the electronic controller of apparatus 10 interrupting operation if the desired monitored condition is not being sensed.

After tray clamps 44 are moved outwardly of the inverted semiconductor carrying tray, the inverted semiconductor carrying tray will be supported by elevator 20 while the input tray is captured by tray captivators 64. Before elevator 20 is moved from its hand-off position, stops 18 are retracted in the preferred form. The trays are then moved so as to position the primer tray in the processing position beneath and spaced from the input tray captured in frame 32. Specifically, elevator 20 is lowered from the hand off position to its lowered position. It should be appreciated that standoffs 80 guide the inverted semiconductor carrying tray as it leaves frame 32 when jaws 52 and 56 separate and during the relative movement between frame 32 and elevator 20. Before elevator 20 reaches its lowered position, the inverted semiconductor carrying tray will engage belts 14 and conveyor 12 and become supported thereby. Continued movement of elevator 20 to its lowered position will space elevator 20 below the inverted semiconductor carrying tray. Thereafter, the inverted semiconductor carrying tray is conveyed in the travel direction from the processing position on conveyor 12 for hand off to the next processing system. Anytime after the tray is moved from the processing position, stops 18 can be moved for engagement with the next input tray.

Simultaneously as elevator 20 moves to its lowered position, lift platform 24 is moved from its hand off position to its upper position. After frame 32 is sufficiently spaced from elevator 20 and conveyor 12, stepper motor 38 is actuated to rotate frame 32 and the input tray captured therein 180°. It can then be appreciated that the input tray then becomes the primer tray for the next inputted tray. The presence of the input tray in frame 32, the presence of the inverted semiconductor carrying tray along conveyor 12, and the position of lift plate 24, frame 32, tray clamps 44 and tray captivators 64 can be monitored by sensors 16, 50, 62, 70, and 82 and the sensors associated with motor 38 and with drive assembly 30, with the electronic controller of apparatus 10 interrupting operation if the desired monitored condition is not being sensed.

It can be appreciated that apparatus 10 according to the teachings of the present invention is able to efficiently and quickly invert the orientation of each of the semiconductor devices in a tray when testing or further processing of the semiconductor devices so require. In the most preferred form, the throughput time for an input tray to enter and an output tray to leave apparatus 10 according to the preferred teachings of the present invention is about 10 to 20 seconds. Additionally, the inverting of the semiconductors occurs with little risk of loss or mispositioning of the semiconductors.

It can also be appreciated that apparatus 10 according to the teachings of the present invention is especially advantageous in the ease of changeover between tray orientation (live bug or dead bug) and between different types of trays as well as which end of the tray is fed into apparatus 10. In particular, tray captivators 64 of the most preferred form are able to be configured according to the particular trays to be processed, with other components being able to or being adjustable to accommodate different tray types, orientations, or directions. In this regard, if only a single tray type, orientation, and direction is going to be processed with apparatus 10, tray captivators 64 can be simplified accordingly according to the teachings of the present invention. Likewise, although manual configuration is utilized in the form shown, automatic configuration of tray captivators 64 could be provided according to the teachings of the present invention.

Additionally, it can be appreciated that apparatus 10 according to the teachings of the present invention closely monitors the operating conditions and interrupts operation if the desired conditions are not sensed. This is particularly advantageous as attention by an operator is required before operation can continue and thereby generally preventing operation when there is a likelihood that devices could lose their reference positioning or be dropped from the trays during operation. Additionally, all of the valves to pneumatic actuators 48, 60, and 68 are normally closed and with the sensing of operating conditions insure that apparatus 10 will remain in positive contact with the tray carrying the components including that the trays stay clamped by tray clamps 44 in the event of power or pneumatic failure and allow recovery of apparatus 10 when operation is regained.

It can be appreciated that conditions are monitored in the most preferred form by multiple sensors at various locations of apparatus 10. However, normal operating conditions and failure recovery modes could be monitored by sensors at other locations or by derivation from other sensors. As an example, the condition sensed by sensor 50 could be derived from comparing conditions monitored by sensors 62 and 82.

Thus since the invention disclosed herein may be embodied in other specific forms without departing from he spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. Method for cyclically inverting a plurality of electronic devices comprising the steps of: providing a primer tray; conveying an input tray carrying the plurality of devices in an input orientation in a one-way travel direction alone a conveying path to a processing position beneath the primer tray; moving at least one of the trays out of the conveying path and positioning the input tray beneath and closely adjacent the primer tray; clamping the input and primer trays together; rotating the clamped trays 180° to position the primer tray beneath the input tray, with the plurality of devices being carried by the primer tray in an output orientation inverted from the input orientation; unclamping the rotated clamped trays; moving at least of the trays after unclamping so as to position the primer tray beneath but spaced from the input tray and into the conveying path; conveying the primer tray carrying the plurality of devices in the output orientation in the travel direction and unclamped from and from beneath the input tray; and orienting the input tray to constitute the, primer tray for a successive cycle.

2. The inverting method of claim 1 wherein the primer tray providing step comprises the steps of providing a frame, with the trays having sides, a front, and a back, and providing tray captivators on the frame for capturing the front and back of the primer tray; wherein the clamping step includes the step of releasing the capturing of the primer tray by the tray captivators; and wherein the unclamping step includes the step of capturing the input tray by the tray captivators.

3. The inverting method of claim 2 wherein the frame includes corner guide standoffs for guiding the corners between the sides, the front and the back of the trays.

4. The inverting method of claim 2 wherein the clamping step comprises the steps of providing first and second pairs of jaws on the frame and movable between an unclamped position and a clamped position, moving the jaws from a home position outward of the trays to a clamping position with the sides of the trays extending between the jaws in the unclamped position, and moving the jaws from the unclamped position to the clamped position while in the clamping position; wherein the rotating step comprises the step of rotating the frame; and wherein the unclamping step comprises the steps of moving the jaws from the clamped position to the unclamped position, and moving the jaws in the unclamped position from the clamping position to the home position.

5. The inverting method of claim 2 wherein the moving steps comprises the steps of moving an elevator abutting with the tray.

6. The inverting method of claim 5 wherein the moving steps comprises the steps of moving the frame including the tray captured by the tray captivators.

7. The inverting method of claim 1 wherein the conveying steps comprise the steps of conveying the tray upon a conveyor having first and second synchronized driven belts.

8. The inverting method of claim 1 further comprising the step of vibrating the clamped trays.

9. The inverting method of claim 1 wherein the primer tray providing step comprises the steps of providing a frame, with the trays having sides, a front, and a back, with the primer tray being removably captured in the frame; wherein the clamping step comprises the steps of providing first and second pairs of jaws on the frame and movable between an unclamped position and a clamped position, moving the jaws from a home position outward of the trays to a clamping position with the sides of the trays extending between the jaws in the unclamped position, and moving the jaws from the unclamped position to the clamped position while in the clamping position; wherein the rotating step comprises the step of rotating the frame; and wherein the unclamping step comprises the steps of moving the jaws from the clamped position to the unclamped position, and moving the jaws in the unclamped position from the clamping position to the home position.

10. The inverting method of claim 9 further comprising the step of vibrating at least one of the first and second pairs of jaws while in the clamped position, with the frame being isolated from the first and second pairs of jaws to reduce vibration transmission from the jaws to the frame.

11. The inverting method of claim 1 wherein the primer tray providing step comprises the steps of providing a frame, with the trays having sides, a front, and a back, with the primer tray being removably captured in the frame; wherein the frame includes corner guide standoffs for guiding the corners between the sides, the front and the back of the trays; and wherein the moving step to position the primer tray spaced from the input tray includes the step of removably capturing the input tray in the frame.

12. The inverting method of claim 1 wherein the step of: orienting the input tray to constitute the primer tray comprises rotating the input tray 180° after the trays are moved after unclamping so that the input tray becomes the primer tray for a next inputted tray.

13. Apparatus for simultaneously placing a plurality of electronic devices contained in a first tray in an inverted orientation in a second tray comprising, in combination: a frame for removably capturing at least the second tray; means for moving, in a one-way travel direction along a conveying path, the first tray between a processing position and a hand off position which is out of the conveying path, with the processing position located beneath but spaced from the second tray captured in the frame and the hand off position located beneath and closely adjacent the second tray captured in the frame; means for removably clamping the first and second trays together and to the frame; and means for rotating the frame while the first and second trays are clamped together wherein, after the first and second trays are unclamped, the second tray is repositioned into the conveying path and the first tray is removably captured by the frame to function as the second tray for a successive cycle.

14. The apparatus of claim 13 further comprising, in combination: corner guide standoffs secured to the frame for guiding the trays relative to the frame.

15. The apparatus of claim 13 wherein the frame includes front and back tray captivators for removably capturing the front and back of at least the second tray, with each of the front and back tray captivators including a rotatable spindle including a plurality of faces, with each of the faces including at least one ear, with the ears having different positions on each of the plurality of faces for engaging different types or orientations of trays.

16. The apparatus of claim 15 wherein the removably clamping means comprises, in combination: first and second pairs of jaws on the frame and movable between an unclamped position and a clamped position; means for moving the jaws between a home position outward of the trays and a clamping position with the sides of the trays extending between the jaws in the unclamped position; and means for moving the jaws between the unclamped position and the clamped position while in the clamping position.

17. The apparatus of claim 15 further comprising, in combination: means for moving the front and back tray captivators relative to the frame between a tray engaging position and a disengaged position.

18. The apparatus of claim 13 wherein the moving means comprises an elevator for abutting with the lower surface of the first tray without extending beyond the front, back and sides of the tray.

19. The apparatus of claim 18 wherein the rotating means comprises, in combination: a lift plate, means for rotatably mounting the frame to the lift plate, and means for rotating the frame in the lift plate; and wherein the moving means comprises means for moving the lift plate between an upper position and the hand off position.

20. The apparatus of claim 13 further comprising, in combination: means for vibrating the removably clamping means while the first and second trays are clamped together; and means for isolating the transmission of vibrations from the removably clamping means to the frame.

\* \* \* \* \*

UNITED STATES PATENT AND TRADEMARK OFFICE
CERTIFICATE OF CORRECTION

PATENT NO.   : 6,190,111 B1
DATED        : February 20, 2001
INVENTOR(S)  : John C. Nuhlicek; James E. Kroenig It is certified that error appears in the above-identified patent and that said Letters Patent is hereby corrected as shown below:

Title Page, Item [57],
Line 11, of the ABSTRACT, delete "input tray s" and substitute therefor
-- input tray is --.
Line 14 of the ABSTRACT, delete "the ay" and substitute therefor -- the tray --.

Column 5,
Line 5, after "apparatus" insert -- 10 --.

Column 7,
Line 55, delete "controller-of" and substitute therefor -- controller of --.

Column 9,
Line 51, delete "alone" and substitute therefor -- along --.
Line 66, delete "the," and substitute therefor -- the --.

Signed and Sealed this

Twenty-fifth Day of September, 2001

Attest:

NICHOLAS P. GODICI
*Attesting Officer*  *Acting Director of the United States Patent and Trademark Office*